United States Patent [19]

Aigo

[11] Patent Number: 4,480,223

[45] Date of Patent: Oct. 30, 1984

[54] UNITARY PROBE ASSEMBLY

[76] Inventor: Seiichiro Aigo, 3-15-13 Negishi, Daito-Ku, Tokyo, Japan

[21] Appl. No.: 324,836

[22] Filed: Nov. 25, 1981

[51] Int. Cl.³ .................... G01R 31/02; G01R 1/06
[52] U.S. Cl. .............................. 324/158 P; 324/72.5; 324/158 F
[58] Field of Search ............... 324/158 P, 158 F, 72.5

[56] References Cited

U.S. PATENT DOCUMENTS 4,116,523 9/1978 Coberly et al. .................. 324/158 P
4,382,228 5/1983 Evans ............................. 324/158 P

OTHER PUBLICATIONS

Byrnes, H. P.; "Test Contactor"; IBM Tech. Dis. Bull.; vol. 18; No. 10; Mar. 1976; p. 3233.

Primary Examiner—Ernest F. Karlsen
Attorney, Agent, or Firm—McGlew and Tuttle

[57] ABSTRACT

The specification describes a unitary probe assembly adapted to inspect semiconductor chips each provided with a plurality of electrode terminals at both inner surface area and outer peripheral edge thereof. Probes are disposed in a plurality of layers and terminate at the free ends thereof in a common plane. The main body portions of the probes are covered by a layer of an insulating material. Owing to the layer of the insulating material, the layers of the probes can be stacked closely without need to worry about their electrical contact, thereby making it possible to reduce the assembly in thickness and rendering its handling and application easier. Since all the probes are disposed at once and secured in place with a suitable resin such as epoxy resin, the fabrication of the probe assembly is easy and efficient.

8 Claims, 5 Drawing Figures

F I G. 2
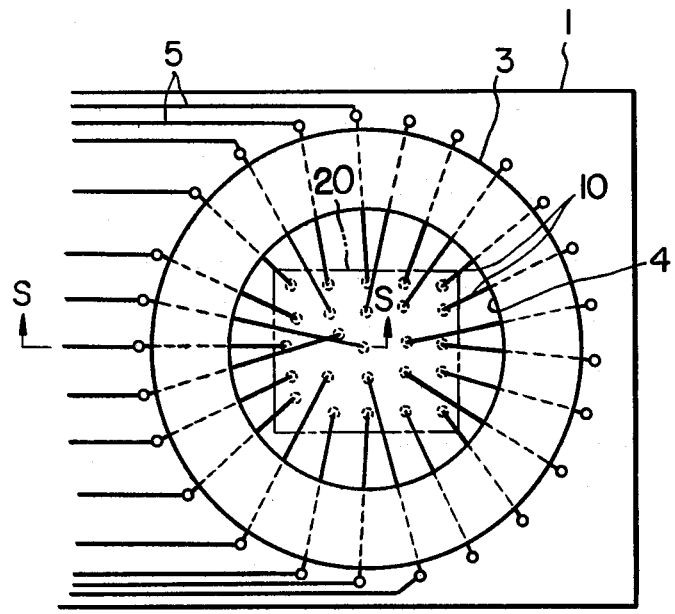
F I G. 3
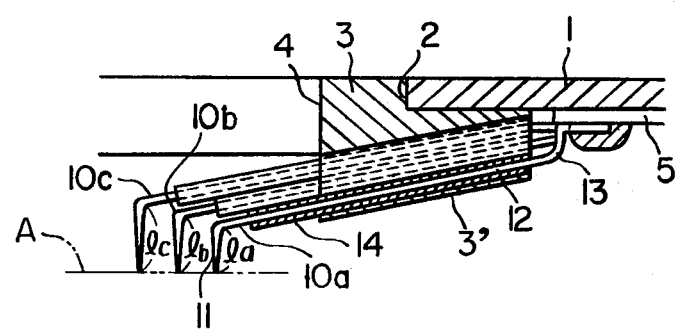

UNITARY PROBE ASSEMBLY

BACKGROUND OF THE INVENTION

1. Field of the Invention

This invention relates to a unitary probe assembly for semiconductor chips provided with built-in microelectronic components. More particularly, it relates to an improved unitary probe assembly adapted to inspect semiconductor chips each provided with electrode terminals not only at the periphery thereof but also at an inner surface area thereof.

2. Description of the Prior Art

Semiconductor chips were conventionally provided at the peripheries thereof with electrode terminals, from which lead wires were extended. There is however a tendency to provide a suitable number of electrode terminals at an inner surface area of a semiconductor chip so as to permit the inspection of characteristics at the inner surface area as well as the extension of lead wires from such an inner surface area.

A unitary probe assembly, which has been employed for the inspection of such recent semiconductor chips, is generally constituted by a group of probes which are brought into contact at the free ends thereof to corresponding electrode terminals disposed at the periphery of each chip and another group of probes which are adapted to contact at the free ends thereof with electrode terminals disposed inwardly of the former electrode terminals. These probes are arranged around an opening of a block attached to a board. In the block, these probes are disposed in separate layers in accordance with the groups, thereby being arranged in the form of a plurality of layers. Accordingly, it was very time-consuming to fabricate such a conventional unitary probe assembly as the disposition of the probes had to be done layer by layer sequentially by, for example, fixing the probes in the first layer around the opening of the block with an epoxy resin and then, after the resin had hardened, placing the probes in the second layer on the thus-hardened epoxy resin and securing the latter probes in place with the same epoxy resin. Furthermore, the prior art probe assembly was accompanied by another drawback that the block became inevitably thicker, since the probes were arranged in a multiplicity of layers and in some instances stereoscopically crossed with one another, thereby requiring to increase the distance beteween each two adjacent probe layers to a certain extent in order to avoid any contact between probes per se.

SUMMARY OF THE INVENTION

The present invention has been completed to solve the drawbacks of the above-described prior art unitary probe assembly. Accordingly, the object of this invention is to provide a unitary probe assembly, which is easy to fabricate and convenient to handle.

In order to achieve the above object of this invention, there is provided a unitary probe assembly adapted to inspect semiconductor chips each provided with a plurality of electrode terminals at both inner surface area and outer peripheral edge thereof. The assembly comprises a board defining an aperture therethrough; a block seated in said aperture and defining at least one opening therethrough; and a suitable number of probes formed of electrically conductive fine wires and arranged aslant around the opening. The probes are disposed in a plurality of layers through said block. They extend at the contact tip portions thereof into the opening and terminate in a common plane. The main body portions of the probes are covered by a layer of an insulating material. Owing to the above construction, it is possible to fixedly secure the probes in all the layers at once and, at the same time, to minimize the thickness of the block.

The above and other objects, features and advantages of the present invention will become apparent from the following description and the appended claims, taken in conjunction with the accompanying drawings.

BRIEF DESCRIPTION OF THE DRAWINGS

FIG. 2 is an enlarged, fragmentary, somewhat schematic view of the unitary probe assembly;

FIG. 3 is a cross-sectional view taken along line S—S in FIG. 2;

DETAILED DESCRIPTION OF THE INVENTION AND PREFERRED EMBODIMENTS

Figure 1:
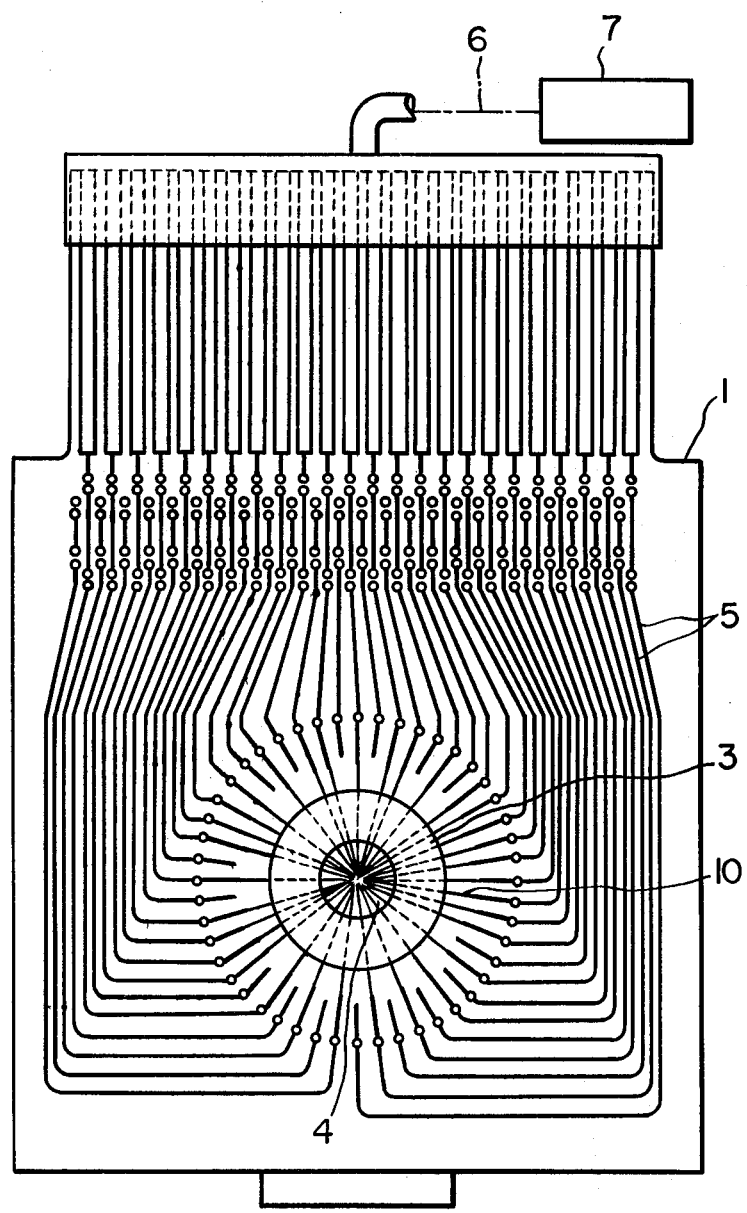
FIG. 1 is a plan view of a unitary probe assembly according to an embodiment of this invention.

FIG. 1 illustrates the overall profile of an example of the unitary probe assembly embodying the present invention. The assembly includes a board 1 carrying a suitable number of probes thereon. An aperture 2 is formed through the board 1 at an appropriate location (see FIG. 3). The aperture 2 is generally circular but may be formed in another shape. The board 1 is of a flat sheet-like configuration and is made of a suitable material such as a synthetic resin. In the aperture 2 of the board 1, is seated a block 3 formed of an epoxy resin or ceramics. In the illustrated embodiment, a circular opening 4 is formed through the block 3 substantially at the center thereof and a suitable number of probes 10 are fixedly provided around the opening 4.

The unitary probe assembly according to this invention is adapted to inspect a semiconductor chip provided with a plurality of electrode terminals at both inner surface area and outer peripheral edge thereof. For its application, the probes 10 incorporated in the assembly are arranged in a plurality of layers with an epoxy resin 3' and disposed adjacently or in some instances stereoscopically crossed with one another. Each of the probes 10 is made of a fine electrically-conductive wire, for example, a wire of approximately 2 cm in length and about 0.2 mm in diameter. The wire is preferably made of tungsten or a beryllium-copper alloy. The free end of each of the probes 10 extends to the position of the opening 4 and its tip is tapered and terminates in a common plane A. The diameter of the tip of each probe 10 is generally 50–60 $\mu$m.

Figure 4:
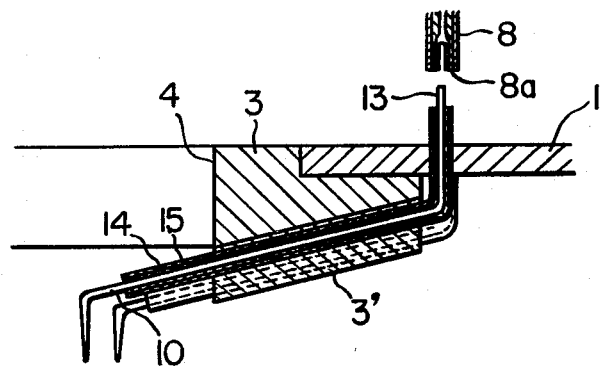
FIG. 4 is a cross-sectional view similar to FIG. 3 but showing another embodiment of this invention.

The principal feature of this invention resides, as shown in FIGS. 3 and 4, in that the main body portion 12 of each of the probes 10 is covered by a layer 14 of an electrically insulating material, whereby avoiding mutual electrical contact of the probes 10. It is preferable to use a dielectric material such as glass or quartz as the insulating material making up the covering layer 14 of each probe 10. The main body portion 12 may be formed into a structure similar to that of a shielded coaxial cable for high-frequency measurement, by applying on the layer 14 a further layer 15 of an electrically conductive material such as copper or nickel in accordance with the vacuum deposition method or electroless plating method if needed.

The terminal end 13 of each of the probes 10 is connected to its corresponding printed circuit trace 5 by soldering and then connected to a tester 7 through the printed circuit trace 5 and a cable 6. As depicted in FIG. 4, each probe 10 may be connected to the tester 7 by means of a shielded coaxial cable covered by an outer shieth containing a layer of a suitable insulating material. In this case, the connection terminal 8a of each cable 8 is formed in such a way that it fits over an end portion 13 of its corresponding probe 10. Where each probe 10 is connected to the tester 7 through its corresponding shielded coaxial cable 8, the probe 10 is exposed to the exterior as a conductor at its contact tip portion 11 and its adjacent portion only. Thus, each probe 10 can be protected from electrical noise due to electrical waves, thereby allowing to conduct accurate tests and making it possible to perform a test with a current of a super high frequency. In FIG. 2, numeral 20 designates a semiconductor chip.

A secondary feature of this invention resides in that, when inspecting a semiconductor chip by means of a unitary probe assembly according to this invention, the same load is exerted to the tip of each of the probes 10 upon contact of the tips of the probes 10 with their corresponding electrode terminals of the chip. Therefore, as shown in FIG. 3, a group of probes 10a whose contact tip portions are located outside on the common plane A are each formed of a finer wire, compared with other groups of probes 10b, 10c whose contact tip portions assume positions inside those of the group of probes 10a. The contact tip portion 11 of each probe 10 is bent downwardly from the main body portion 12 and is vertical to the plane of the board 1. Each probe 10 therefore serves as a cantilever spring which bears loads at its free end. Probes whose contact tip portions are located inside have longer main body portions, compared with probes whose contact tip portions are situated outside. Thus, the former probes require a relatively large flexural strength. To meet this requirement, the probes 10 become thickner as their contact tip portions are located closer to the center of the opening. By "main body portion" as used herein is indicated an intermediate portion of each of the probes 10, excluding the contact tip portion 11 and its opposite connection terminal end portion 13. Each probe 10 is fixedly secured to the block 3 at its main body portion 12. The contact tip portions 11 of the probes 10 have longer lengths as they are located closer to the center of the opening. Supposing the lengths of the contact tip portions of the probes 10a, 10b, 10c be respectively $l_a$, $l_b$, and $l_c$ toward the center of the opening, these lengths satisfy the following inequality: $l_a < l_b < l_c$. When the same load is applied to the tip of each probe 10, the characteristics of each semiconductor chip can be inspected accurately and, at the same time, the service life of the unitary probe assembly can be prolonged.

Figure 5:
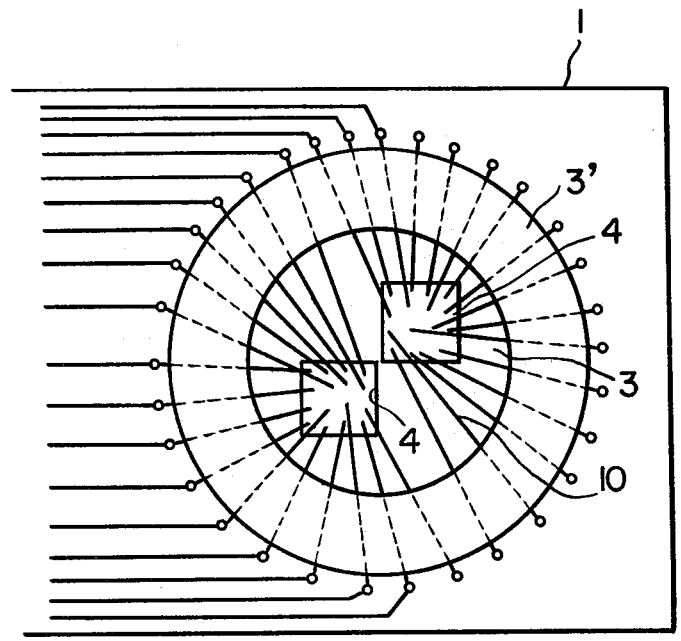
FIG. 5 is a fragmentary plan view illustrating a further embodiment of this invention.

In the above embodiments, the opening 4 of the block 3 is formed circular but it shall not be construed that the shape of the opening 4 is limited to a circular one. Square or other shapes may also be feasible. In addition, a plurality of openings 4 may be formed through the block 3, including two openings as depicted in FIG. 5. Where a pluralty of openings 4 are provided, a suitable number of probes 10 are arranged around each of the openings 4. It will be easily envisaged that the present invention can be similarly embodied even if a plurality of openings 4 are formed through the block 3. Needless to say, where a unitary probe assembly is provided with two openings, it is possible to conduct the inspection of two semiconductor chips simultaneously.

As has been described above, according to this invention, the main body portion of each probe is covered by a layer of an electrically insulating material. Thus, it is not necessary to worry about possible electrical contact between probes even if they are disposed closely to one another or even crossed stereoscopically, thereby making it possible to decrease the distance between each two adjacent probe layers in an installation block and, corollary to this, rendering the probe assembly convenient for application and handling. The above structure makes the manufacture of probe assemblies easier, since it is unnecessary to secure the probe layers one by one but all the probes can be disposed at once and then secured in place with an epoxy resin simultaneously.

Having now fully described the invention, it will be apparent to one of ordinary skill in the art that many changes and modifications can be made thereto without departing from the spirit or scope of the invention as set forth herein.

What is claimed is:

1. A unitary probe assembly adapted to inspect semiconductor chips each provided with a plurality of electrode terminals at both an inner surface area and an outer peripheral edge thereof, comprising: a board defining an aperture therethrough; a block seated in said aperture and defining at least one opening therethrough; a plurality of probes each formed of electrically conductive fine wires and arranged aslant around said opening; each probe having a contact tip portion at one end and a terminal end portion at an opposite end; said probes being disposed in a plurality of layers through said block, extending at the contact tip portions thereof into said opening and terminating in a common plane; each probe having a main body portions between said contact tip and terminal end portions, covered by a layer of an insulating material; and a layer of an electrically conductive material convering said layer of insulating material for shielding each said main body portion of each probe.

2. The unitary probe assembly as claimed in claim 1, wherein said insulating material is a dielectric material.

3. The unitary probe assembly as claimed in claim 1, wherein said block defines only one opening therethrough.

4. The unitary probe assembly as claimed in claim 1, wherein said block defines a plurality of openings therethrough.

5. The unitary probe assembly as claimed in claim 1, wherein the terminal end of each of said probe is connected to a tester through a printed circuit trace.

6. The unitary probe assembly as claimed in claim 1, wherein the terminal end of each of said probe is connected to a tester through a shielded coaxial cable.

7. The unitary probe assembly as claimed in claim 1, wherein probes whose contact tip portions are located outside at said common plane with respect to a center of said at least one opening, are formed of finer wires compared with probes whose contact tip portions are located inside with respect to said center.

8. A unitary probe assembly as claimed in claim 1 wherein, said contact tip portion of each probe is L-shaped, one leg of said L-shaped contact tip portion connected to said main body portion and another leg of said contact tip portion extending to said common plane, a length of each leg extending to said common plane being shorter for probes located closer to a periphery of said at least one opening in said block then for probes located near a center of said at least one opening in said block.

* * * * *